United States Patent
Choi

(10) Patent No.: US 7,750,399 B2
(45) Date of Patent: Jul. 6, 2010

(54) MOS TRANSISTORS HAVING RECESSED CHANNEL REGIONS AND METHODS OF FABRICATING THE SAME

(75) Inventor: Jay-Bok Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 70 days.

(21) Appl. No.: 11/957,810

(22) Filed: Dec. 17, 2007

(65) Prior Publication Data

US 2008/0203428 A1 Aug. 28, 2008

(30) Foreign Application Priority Data

Feb. 23, 2007 (KR) ............. 10-2007-0018443

(51) Int. Cl.
*H01L 29/94* (2006.01)
(52) U.S. Cl. ............. 257/330; 257/328; 257/341; 257/E29.01; 257/E29.257; 257/E29.26
(58) Field of Classification Search .......... 257/330, 257/328, 341, E29.01, E29.257, E29.26
See application file for complete search history.

(56) References Cited

U.S. PATENT DOCUMENTS

| 7,223,679 B2 | 5/2007 | Murthy et al. | |
| 2005/0116217 A1* | 6/2005 | Jones et al. | 257/19 |
| 2007/0004127 A1 | 1/2007 | Lee | |
| 2008/0048258 A1* | 2/2008 | de Fresart et al. | 257/341 |
| 2008/0169493 A1* | 7/2008 | Lee et al. | 257/296 |

FOREIGN PATENT DOCUMENTS

| KR | 1020050004352 A | 1/2005 |
| KR | 1020050122475 A | 12/2005 |
| KR | 1020060077546 A | 7/2006 |
| KR | 1020060118072 A | 11/2006 |
| KR | 1020070112557 A | 11/2007 |

OTHER PUBLICATIONS

Chen, Xiangdong et al., Hole and Electron Mobility Enhancement in Strained SiGe Vertical MOSFETs, IEEE Transactions on Electron Devices, Sep. 2001, pp. 1975-1980, vol. 48, No. 9.

* cited by examiner

*Primary Examiner*—Long K Tran
(74) *Attorney, Agent, or Firm*—Volentine & Whitt, PLLC

(57) ABSTRACT

A MOS transistor having a recessed channel region is provided. A MOS transistor includes a source region and a drain region disposed in an active region of a semiconductor substrate and spaced apart from each other. A gate trench structure is disposed in the active region between the source and drain regions. A gate electrode is disposed in the gate trench structure. A gate dielectric layer is interposed between the gate trench structure and the gate electrode. A semiconductor region is disposed between the gate trench structure and the gate dielectric layer. The semiconductor region is formed of a different material from the active region. A method of fabricating the MOS transistor having a recessed channel region is also provided.

5 Claims, 10 Drawing Sheets

MOS TRANSISTORS HAVING RECESSED CHANNEL REGIONS AND METHODS OF FABRICATING THE SAME

CROSS-REFERENCE TO RELATED APPLICATION

This application claims the benefit of Korean Patent Application No. 10-2007-0018443, filed on Feb. 23, 2007, the contents of which are hereby incorporated herein by reference in their entirety.

BACKGROUND OF THE INVENTION

1. Field of the Invention

The present invention relates to a MOS transistor and a method of fabricating the same and, more particularly, to a MOS transistor having a recessed channel region and a method of fabricating the same.

2. Description of Related Art

Semiconductor devices have widely employed discrete devices, such as field effect transistors (FETs), as switching devices. Generally, the operating speed of a transistor depends on an activation current supplied to a channel region formed between a source region and a drain region. Conventionally, a planar transistor may be prepared by forming a gate electrode and source and drain regions in a device forming region of a substrate, i.e., an active region. The conventional planar transistor includes a planar channel region interposed between the source and drain regions. An activation current of the planar transistor is proportional to the width of the active region and inversely proportional to a distance between the source and drain regions, i.e., a gate length. Thus, the gate length should be reduced to increase the activation current and the operating speed of a device. However, as the distance between the source and drain regions decreases, a short channel effect (SCE) may occur in the planar transistor.

In order to overcome the SCE, and also downscale the transistor, a transistor having a recessed channel region has been proposed. The recess-channel transistor has a greater effective channel length than that of a planar transistor. In other words, the recess-channel transistor can structurally improve problems caused by the SCE.

A method of fabricating a recess-channel transistor is disclosed by Lee in U.S. Patent Publication No. 2007/0004127 A1 entitled "Method of Fabricating a Transistor Having the Round Corner Recess Channel Structure." A recess-channel MOS transistor disclosed by Lee has a greater effective channel length than that of a conventional planar transistor. However, relatively smaller current flows through the recess-channel MOS transistor disclosed by Lee compared to a planar transistor designed at the same threshold voltage. That is, the recess-channel transistor is inferior in current drivability with respect to the planar transistor.

What is needed is a transistor that has a greater effective channel length than a planar transistor, together with the relatively high current driveability of a planar transistor.

SUMMARY OF THE INVENTION

An embodiment of the present invention provides a MOS transistor having high carrier mobility and recessed channel regions. In embodiments of the invention, a recessed channel region is formed using a gate trench structure disposed in the active region between the source and drain regions. A semiconductor region is formed on the gate trench structure using a different material from the active region to provide high carrier mobility.

Another embodiment of the present invention provides a method of fabricating a MOS transistor having high carrier mobility and recessed channel regions.

In one aspect, the present invention is directed to a MOS transistor having a recessed channel region. The MOS transistor includes: an active region of a semiconductor substrate, the active region having a source region and a drain region disposed therein; a gate trench structure disposed in the active region between the source and drain regions; a gate electrode disposed in the gate trench structure; a gate dielectric layer interposed between the gate trench structure and the gate electrode; and a semiconductor region disposed between at least a portion of the gate trench structure and the gate dielectric layer and formed of a different material from the active region.

In another respect, the invention is directed to a method of fabricating a MOS transistor. The method includes: forming a gate trench structure in an active region of a semiconductor substrate; forming a semiconductor region in at least a portion of the gate trench structure, wherein the semiconductor region is formed of a different material from the active region; forming a gate dielectric layer on the semiconductor substrate having the semiconductor region; and forming a gate electrode on the gate dielectric layer disposed in the gate trench structure.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF THE INVENTION

Figure 1A:
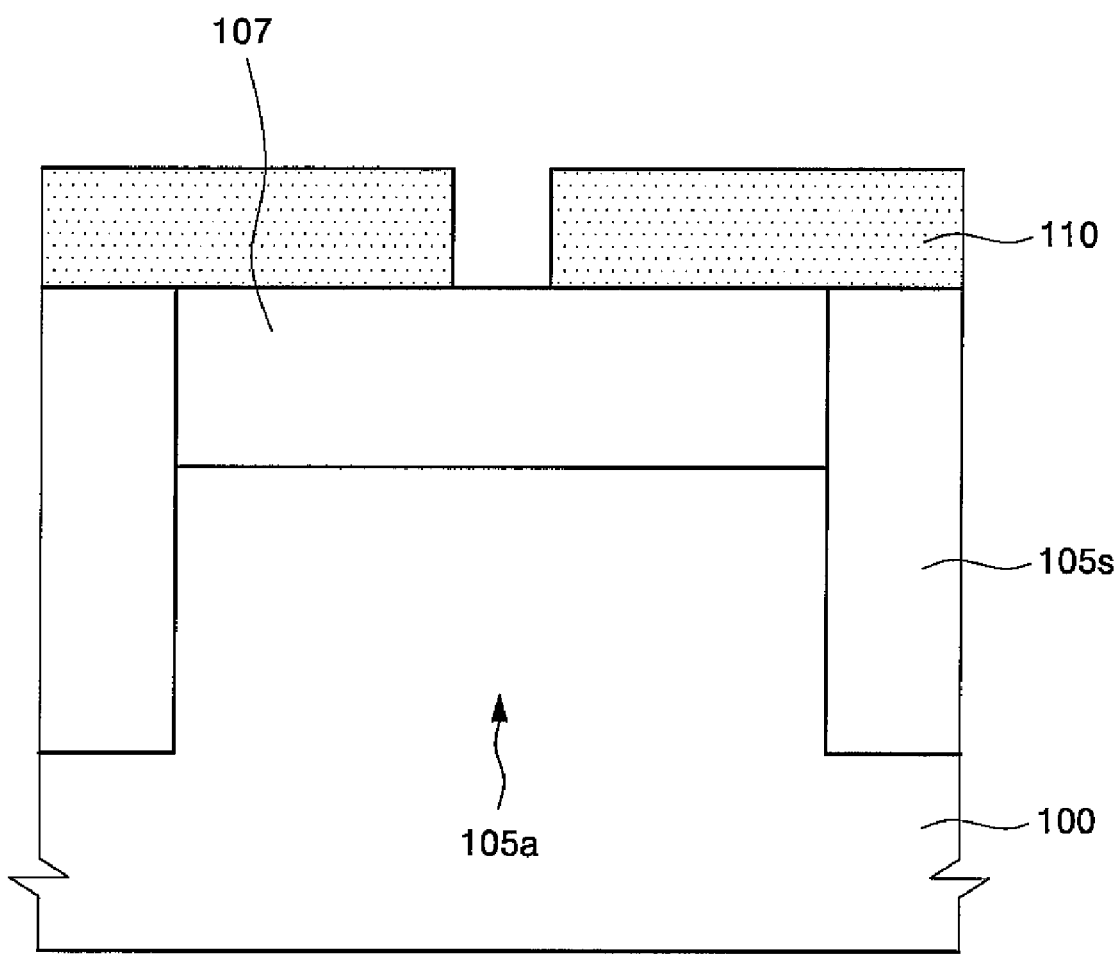
FIGS. 1A through 1F are cross-sectional views of a MOS transistor according to an exemplary embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements.

FIGS. 1A through 1F are cross-sectional views of a MOS transistor according to an exemplary embodiment of the present invention. First, a MOS transistor according to an exemplary embodiment of the present invention will be described with reference to FIG. 1F.

Figure 1B:
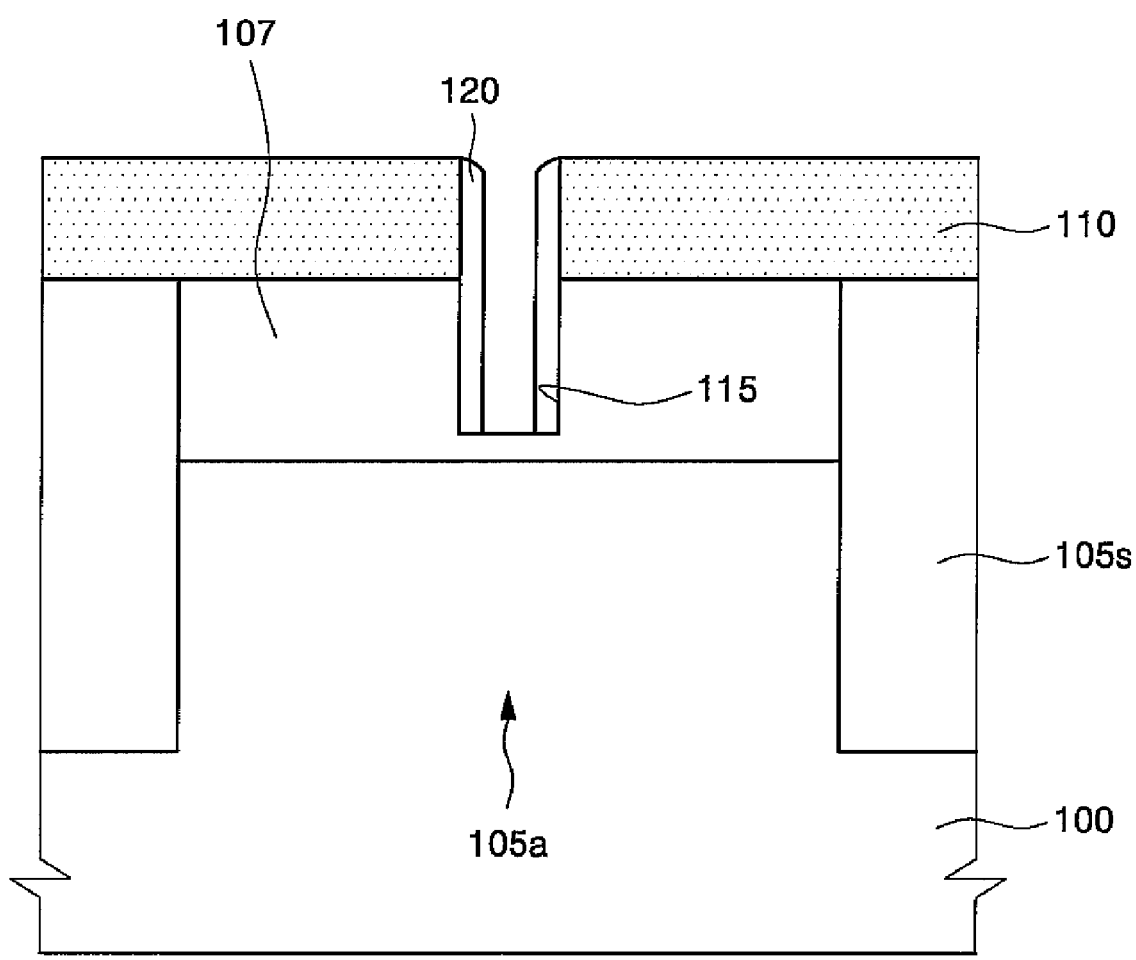
Figure 1C:
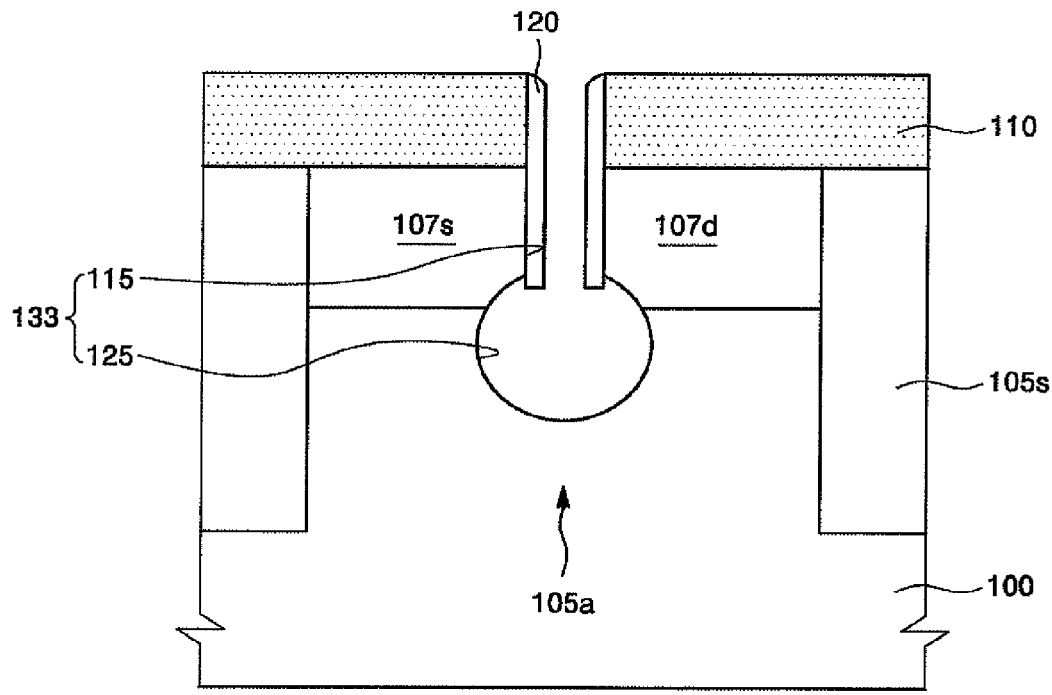
Figure 1D:
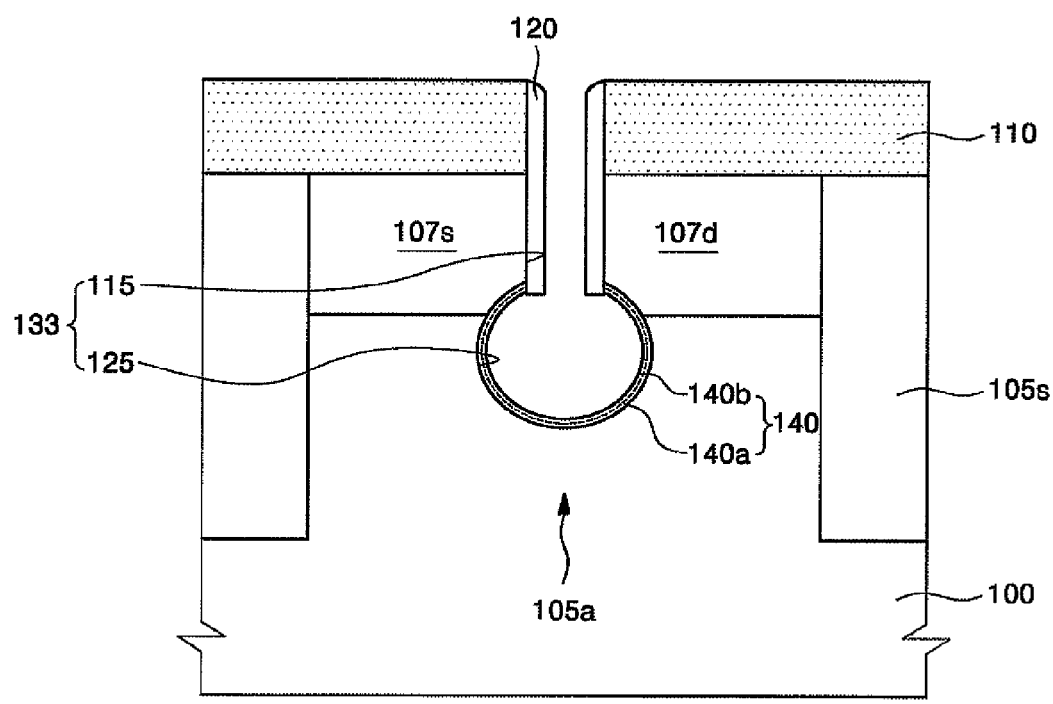
Figure 1E:
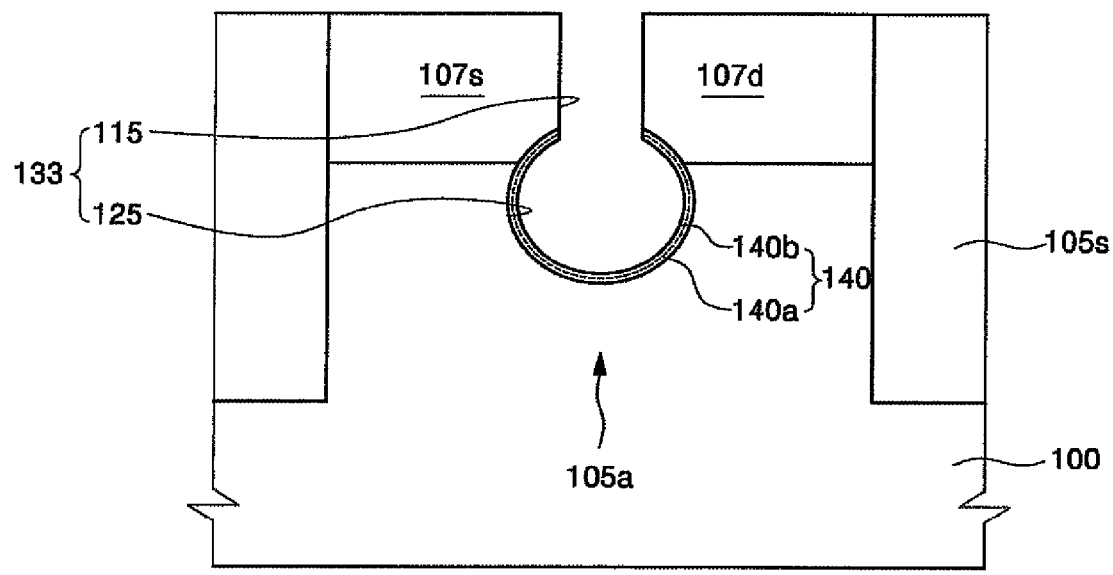
Figure 1F:
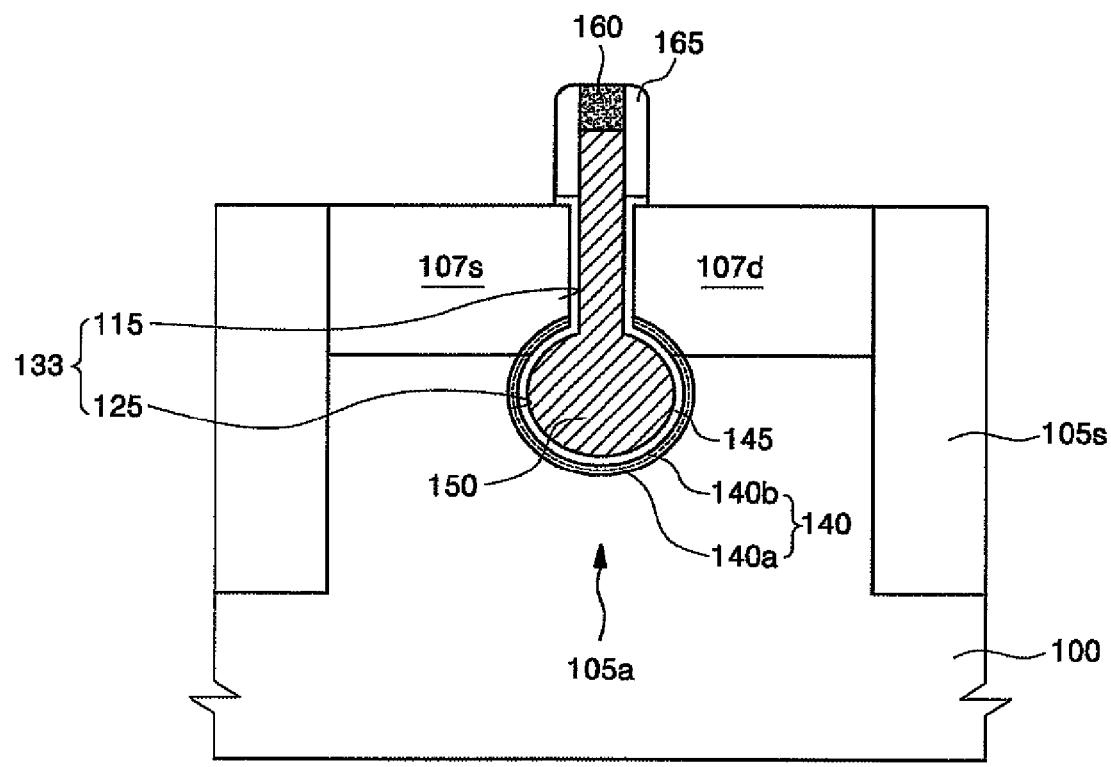

Referring to FIG. 1F, an isolation layer 105s may be disposed in a semiconductor substrate 100 to define an active region 105a. The active region 105a may be formed of a silicon (Si) layer. A source region 107s and a drain region 107d may be disposed in the active region 105a. The source and drain regions 107s and 107d may be spaced apart from each other. A gate trench structure 133 may be disposed in the active region 105a between the source and drain regions 107s and 107d. The source and drain regions 107s and 107d may be disposed at a higher level than a bottom region of the gate trench structure 133. The gate trench structure 133 may include an upper gate trench 115 and a lower gate trench 125. The upper gate trench 115 crosses the active region 105a, and the lower gate trench 125 is disposed under the upper gate trench 115 and has a greater width than the upper gate trench 115. The lower gate trench 125 may have a rounded sidewall. The lower gate trench 125 may have a rounded bottom region.

A gate electrode 150 is disposed in the gate trench structure 133. The gate electrode 150 may fill the gate trench structure 133 and have a protrusion disposed at a higher level than the active region 105a. Alternatively, a buried gate electrode may be provided in the gate trench structure 133.

A gate dielectric layer 145 may be disposed between the gate electrode 150 and the gate trench structure 133. The gate dielectric layer 145 may be a thermal oxide layer or a high-k dielectric layer.

A semiconductor region 140 may be disposed between the gate dielectric layer 145 and the gate trench structure 133. The semiconductor region 140 may be interposed between an inner wall of the lower gate trench 125 and the gate dielectric layer 145. The semiconductor region 140 may be formed of a different material from the active region 105a. The semiconductor region 140 may be formed of silicon-germanium (SiGe), which has higher carrier mobility than silicon (Si). For example, the semiconductor region 140 may be formed of a SiGe layer or a SiGe layer 140a and a Si layer 140b which are sequentially stacked.

Thus, the MOS transistor having a recessed channel region may be provided. The recessed channel region of the MOS transistor includes the semiconductor region 140 formed of SiGe having a higher carrier mobility than Si, so that the MOS transistor can have improved carrier mobility. In other words, a distance between the source region 107s and the drain region 107d, i.e., an effective channel length, can be increased to prevent the performance of the transistor from deteriorating due to a short channel effect (SCE). In spite of the increased effective channel length, a reduction in activation current can be inhibited by forming the semiconductor region 140 of SiGe in the recessed channel region.

Next, a MOS transistor according to another exemplary embodiment of the present invention will be described with reference to FIG. 2B.

Figure 2A:
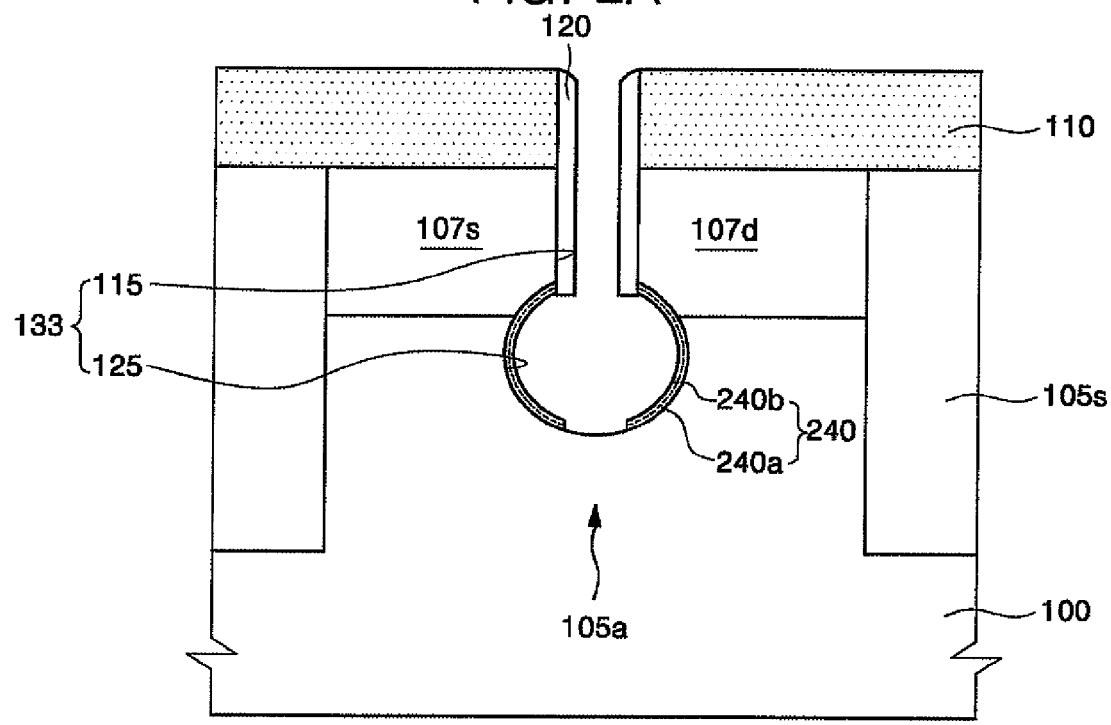
FIGS. 2A and 2B are cross-sectional views of a MOS transistor according to another exemplary embodiment of the present invention.
Figure 2B:
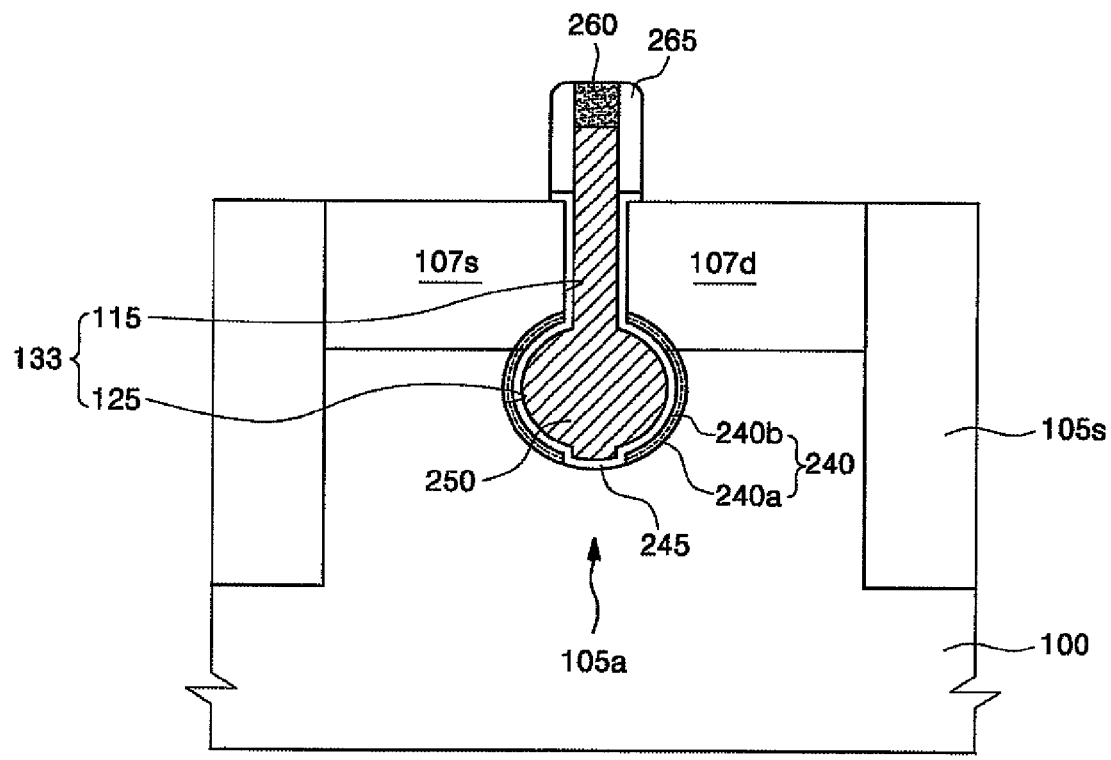

Referring to FIG. 2B, a source region 107s and a drain region 107d may be disposed apart from each other in an active region 105a of a semiconductor substrate 100. Also, a gate trench structure 133 including an upper gate trench 115 and a lower gate trench 125 may be disposed in the active region 105a between the source and drain regions 107s and 107d.

A gate electrode 250 may be disposed in the gate trench structure 133. The gate electrode 250 may fill the gate trench structure 133 and have a protrusion disposed at a higher level than the active region 105a. Alternatively, a buried gate electrode may be disposed in the gate trench structure 133.

A gate dielectric layer 245 may be disposed between the gate electrode 250 and the gate trench structure 133. The gate dielectric layer 245 may be a thermal oxide layer or a high-k dielectric layer.

A semiconductor region 240 may be disposed between the gate dielectric layer 245 and the gate trench structure 133. The semiconductor region 240 may be interposed between a sidewall of the lower gate trench 125 and the gate dielectric layer 245. As indicated in FIG. 2B, the semiconductor region 240 may not extend between a bottom portion of the lower gate trench 125 and a bottom portion of the gate dielectric layer 245. The semiconductor region 240 may be formed of a different material from the active region 105a. The semiconductor region 240 may be formed of SiGe, which has higher carrier mobility than Si. For example, the semiconductor region 240 may be formed of a SiGe layer or a SiGe layer 240a and a Si layer 240b which are sequentially stacked.

Thus, the MOS transistor having a recessed channel region may be provided. The recessed channel region of the MOS transistor includes the semiconductor region 240 formed of SiGe having a higher carrier mobility than Si, so that the MOS transistor can have improved carrier mobility.

Next, a MOS transistor according to still another exemplary embodiment of the present invention will be described with reference to FIG. 3B.

Figure 3A:
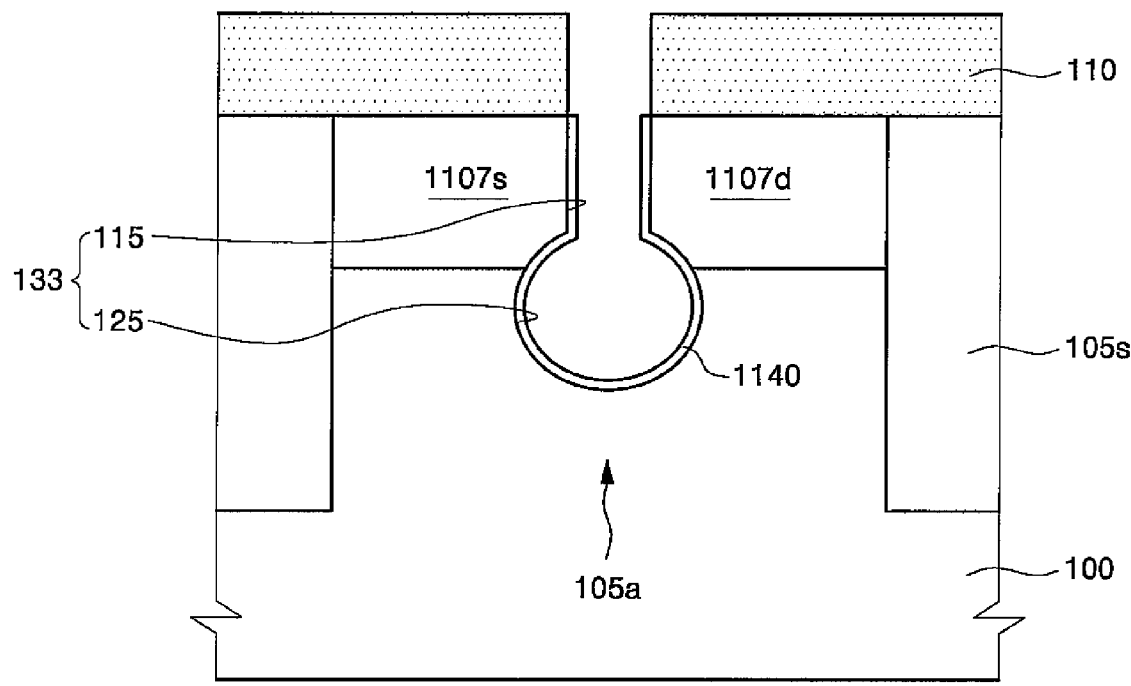
FIGS. 3A and 3B are cross-sectional views of a MOS transistor according to still another exemplary embodiment of the present invention.
Figure 3B:
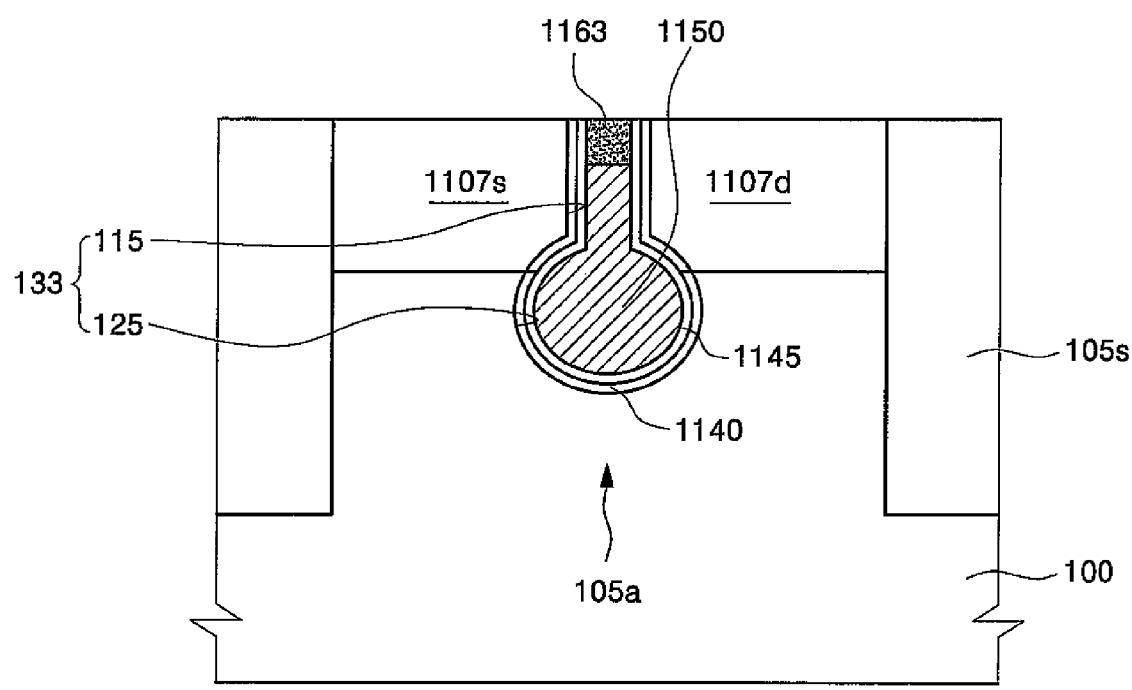

Referring to FIG. 3B, a source region 1107s and a drain region 1107d may be disposed apart from each other in an active region 105a of a semiconductor substrate 100. Also, a gate trench structure 133 including an upper gate trench 115 and a lower gate trench 125 may be disposed in the active region 105a between the source and drain regions 1107s and 1107d.

A semiconductor region 1140 may be disposed on an inner wall of the gate trench structure 133. The semiconductor region 1140 may be formed of a different material from the active region 105a. The semiconductor region 1140 may be formed of SiGe, which has higher carrier mobility than Si. For example, the semiconductor region 1140 may be formed of a SiGe layer or a SiGe layer and a Si layer which are sequentially stacked. A gate dielectric layer 1145 may be disposed on the semiconductor region 1140. The gate dielectric layer 1145 may be a thermal oxide layer or a high-k dielectric layer.

A gate electrode 1150 may be disposed on the gate dielectric layer 1145. The gate electrode 1150 may be buried in the gate trench structure 133. An insulating pattern 1163 may be disposed on the gate electrode 1150. By burying the gate electrode 1150 in the gate trench structure 133, a semiconductor device can be highly integrated. In an alternative embodiment, the gate electrode 1150 may be replaced by a gate electrode that fills the gate trench structure 133 and has a protrusion disposed at a higher level than the active region 105a.

Next, a MOS transistor according to yet another exemplary embodiment of the present invention will be described with reference to FIG. 4B.

Figure 4A:
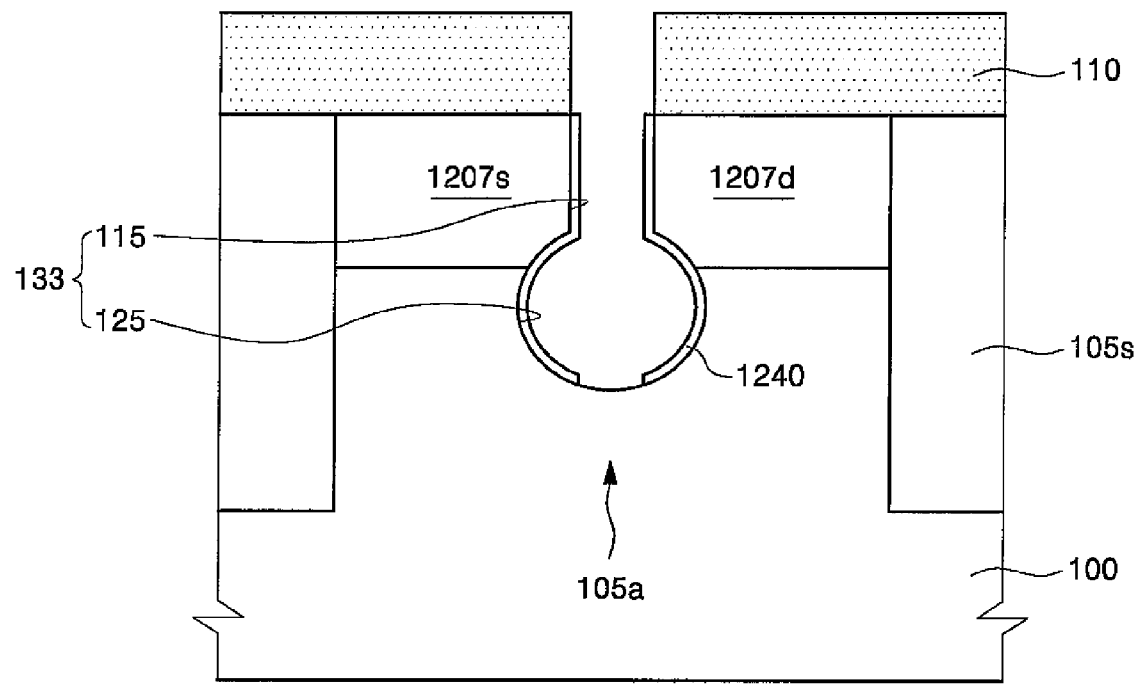
FIGS. 4A and 4B are cross-sectional views of a MOS transistor according to yet another exemplary embodiment of the present invention.
Figure 4B:
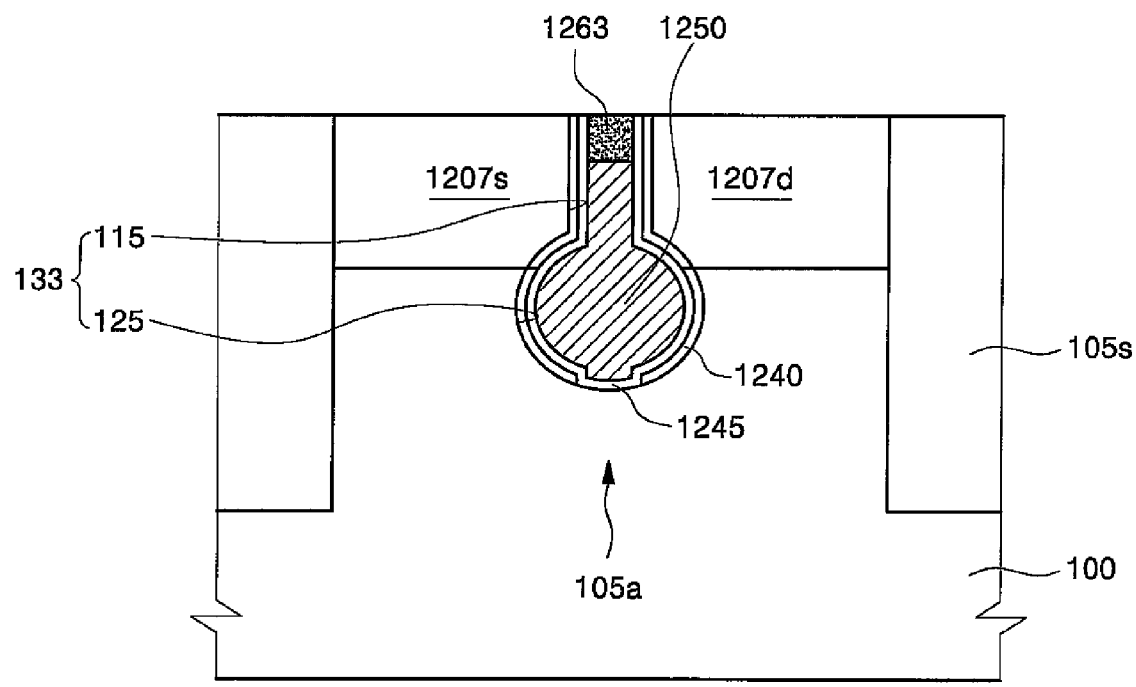

Referring to FIG. 4B, a source region 1207s and a drain region 1207d may be disposed apart from each other in an active region 105a of a semiconductor substrate 100. Also, a gate trench structure 133 including an upper gate trench 115 and a lower gate trench 125 may be disposed in the active region 105a between the source and drain regions 1207s and 1207d.

A gate electrode 1250 may be disposed in the gate trench structure 133. The gate electrode 1250 may be buried in the gate trench structure 133. Alternatively, a gate electrode may fill the gate trench structure 133 and have a protrusion disposed at a higher level than the active region 105a.

A gate dielectric layer 1245 may be disposed between the gate electrode 1250 and the gate trench structure 133. The gate dielectric layer 1245 may be a thermal oxide layer or a high-k dielectric layer.

A semiconductor region 1240 may be disposed between the gate dielectric layer 1245 and the gate trench structure 133. The semiconductor region 1240 may be interposed between a sidewall of the gate trench structure 133 and the gate dielectric layer 1245. As indicated in FIG. 4B, the semiconductor region 1240 may not extend between a bottom portion of the lower gate trench 125 and a bottom portion of the gate dielectric layer 1245. The semiconductor region 1240 may be formed of a different material from the active region 105a. The semiconductor region 1240 may be formed of SiGe, which has higher carrier mobility than Si. For example, the semiconductor region 1240 may be formed of a SiGe layer or a SiGe layer and a Si layer which are sequentially stacked.

Next, a MOS transistor according to yet another exemplary embodiment of the present invention will be described with reference to FIG. 5C.

Figure 5A:
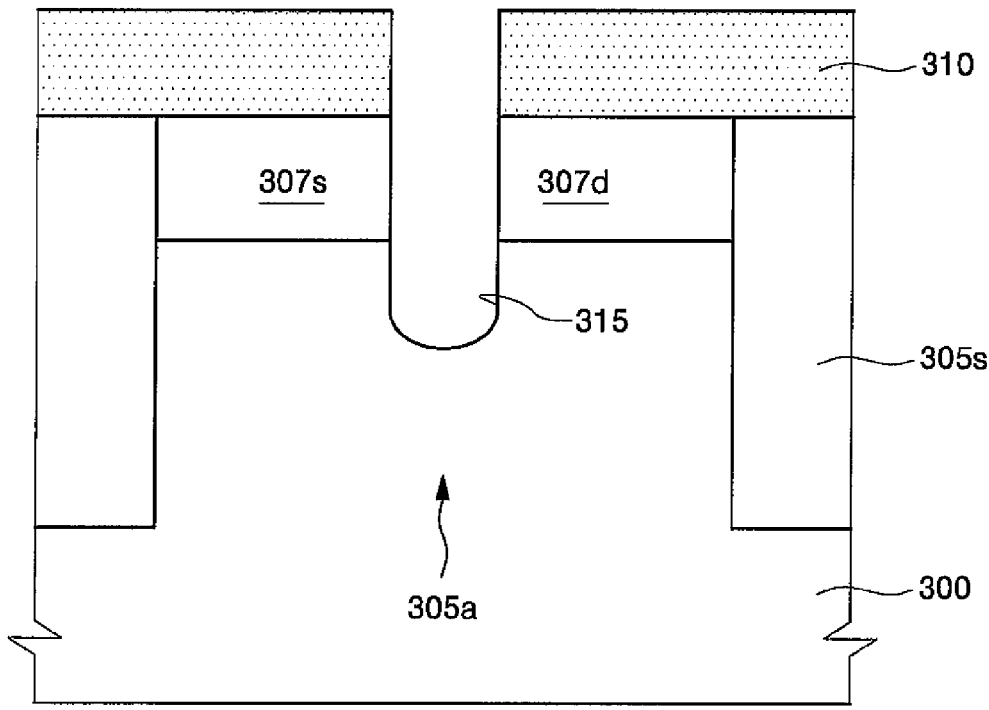
FIGS. 5A through 5C are cross-sectional views of a MOS transistor according to yet another exemplary embodiment of the present invention.
Figure 5B:
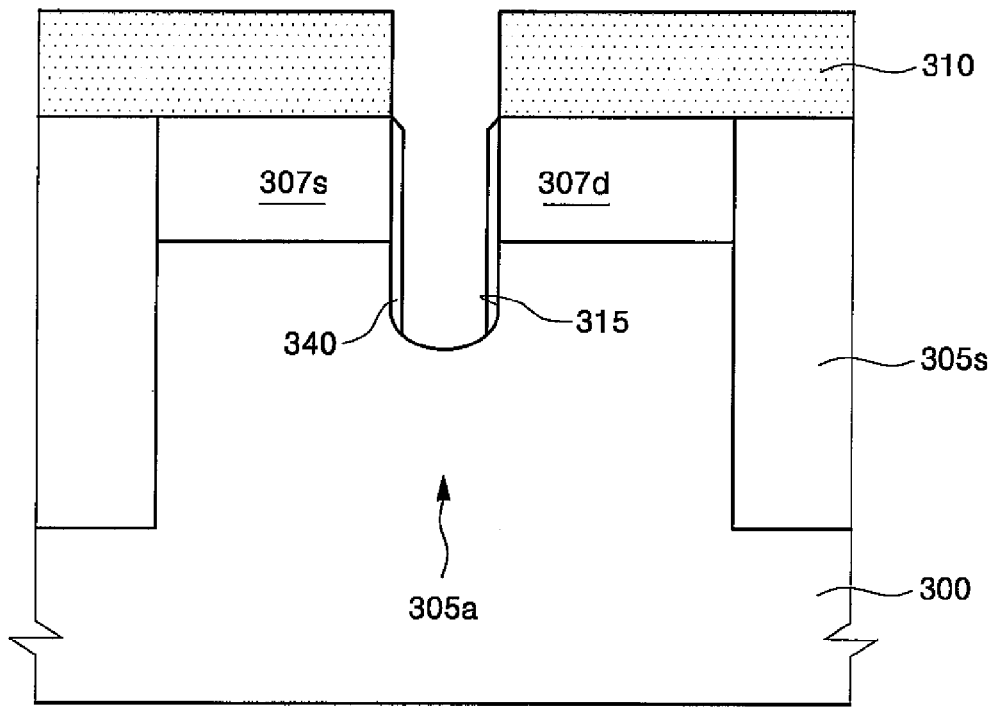
Figure 5C:
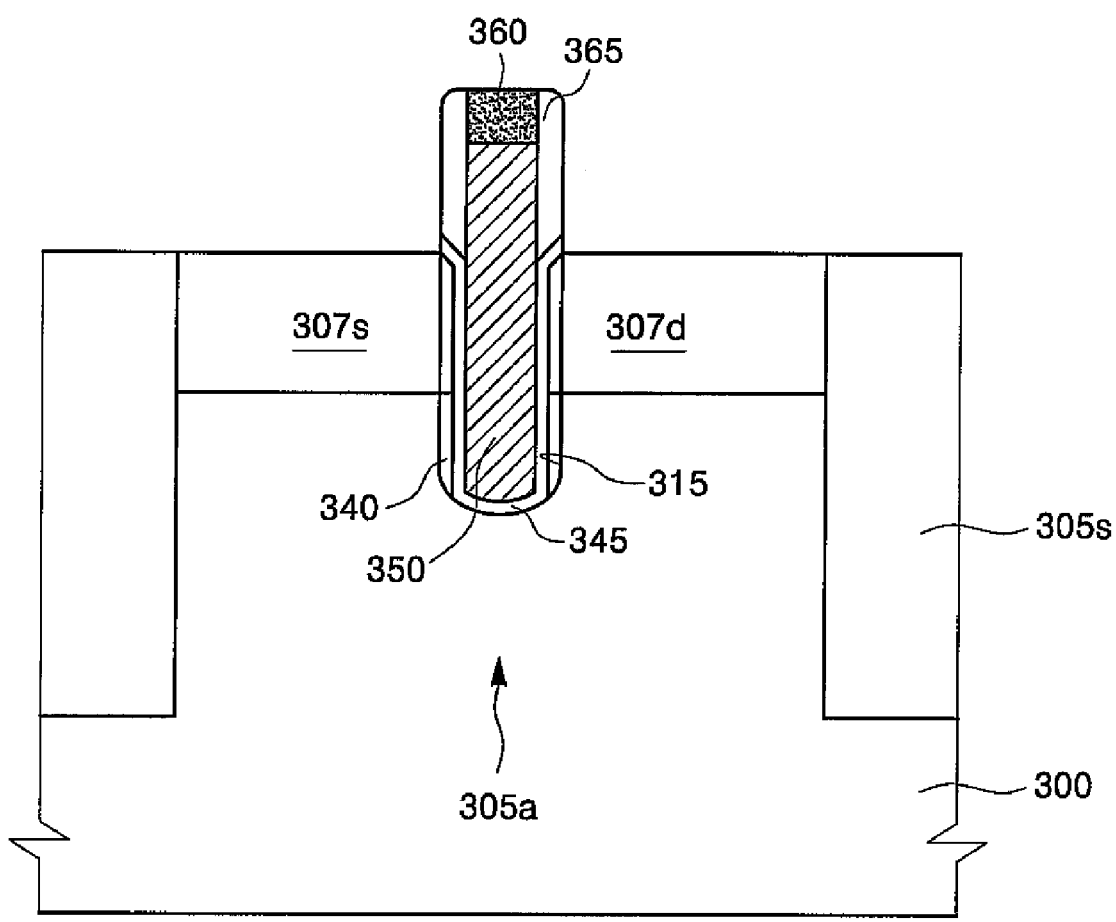

Referring to FIG. 5C, an isolation layer 305s may be disposed in a semiconductor substrate 300 to define an active region 305a. The active region 305a may be formed of a Si layer. A source region 307s and a drain region 307d may be disposed apart from each other in the active region 305a. A gate trench structure 315 may be disposed in the active region 105a between the source and drain regions 307s and 307d. The gate trench structure 315 may cross the active region 305a and have a vertical sidewall.

A gate electrode 350 may be disposed in the gate trench structure 315. The gate electrode 350 may fill the gate trench structure 315 and have a protrusion disposed at a higher level than the active region 305a. Alternatively, a buried gate electrode may be disposed in the gate trench structure 315.

A gate dielectric layer 345 may be disposed between the gate electrode 350 and the gate trench structure 315. The gate dielectric layer 345 may be a thermal oxide layer or a high-k dielectric layer.

A semiconductor region 340 may be disposed between the gate dielectric layer 345 and the gate trench structure 315. The semiconductor region 340 may be interposed between the vertical sidewall of the gate trench structure 315 and the gate dielectric layer 345. As indicated in FIG. 5C, the semiconductor region 340 may not extend between a bottom portion of the gate trench 315 and a bottom portion of the gate dielectric layer 345. The semiconductor region 340 may be formed of a different material from the active region 305a. The semiconductor region 340 may be formed of SiGe, which has higher carrier mobility than Si. For example, the semiconductor region 340 may be formed of a SiGe layer or a SiGe layer and a Si layer which are sequentially stacked.

Thus, the MOS transistor having a recessed channel region may be provided. The recessed channel region of the MOS transistor includes the semiconductor region 340 formed of SiGe having a higher carrier mobility than Si, so that the MOS transistor can have improved carrier mobility. Furthermore, since the semiconductor region 340 is disposed on the vertical sidewall of the gate trench structure 315, carrier mobility characteristics of the MOS transistor can be further enhanced. This is due to the fact that the SiGe layer forming the semiconductor region 340 has higher carrier mobility on a vertical plane than on a horizontal plane of the semiconductor substrate 300.

Next, a MOS transistor according to yet another exemplary embodiment of the present invention will be described with reference to FIG. 6C.

Referring to FIG. 6C, an isolation layer 405s may be disposed in a semiconductor substrate 400 to define an active region 405a. The active region 405a may be formed of a silicon layer. A source region 407s and a drain region 407d may be disposed apart from each other in the active region 405a. A gate trench structure 415 may be disposed in the active region 405a between the source and drain regions 407s and 407d. The gate trench structure 415 may cross the active region 405a and have positively sloped sidewalls that become narrower from an upper region of the gate trench structure 415 toward a lower region thereof. Also, a boundary region between both sidewalls of the gate trench structure 415 may be rounded.

A gate electrode 450 may be disposed in the gate trench structure 415. The gate electrode 450 may fill the gate trench structure 415 and have a protrusion disposed at a higher level than the active region 405a. Alternatively, a buried gate electrode may be disposed in the gate trench structure 415.

A gate dielectric layer 445 may be disposed between the gate electrode 450 and the gate trench structure 415. The gate dielectric layer 445 may be a thermal oxide layer or a high-k dielectric layer.

A semiconductor region 440 may be disposed between the gate dielectric layer 445 and the gate trench structure 415. The semiconductor region 440 may be formed of a different material from the active region 405a. The semiconductor region 440 may be formed of SiGe, which has higher carrier mobility than Si. For example, the semiconductor region 440 may be formed of a SiGe layer or a SiGe layer and a Si layer which are sequentially stacked.

Thus, the MOS transistor having a recessed channel region may be provided. The recessed channel region of the MOS transistor includes the semiconductor region 440 formed of SiGe having a higher carrier mobility than Si, so that the MOS transistor can have improved carrier mobility.

Hereinafter, methods of fabricating MOS transistors according to exemplary embodiments of the present invention will be described.

First, a MOS transistor according to an exemplary embodiment of the present invention will be described with reference to FIGS. 1A through 1F.

Referring to FIG. 1A, an isolation region 105s may be formed in a semiconductor substrate 100 to define an active region 105a. The isolation region 105s may be formed of a silicon oxide layer. The active region 105a may be formed of a silicon layer. An impurity region 107 may be formed in the active region 105a. The impurity region 107 may have a different conductivity than the active region 105a.

A mask pattern 110 may be formed to expose a predetermined region of the active region 105a. For example, the mask pattern 110 may be formed to have an opening crossing the active region 105a. The mask pattern 110 may be formed of a material having an etch selectivity with respect to the isolation region 105s. For instance, when the isolation region 105s may be formed of a silicon oxide layer, the mask pattern 110 may be formed of a silicon nitride layer.

Referring to FIG. 1B, the active region 105a may be anisotropically etched using the mask pattern 110 as an etch mask to form an upper gate trench 115. A sacrificial spacer 120 may be formed on a sidewall of the upper gate trench 115 and a sidewall of the mask pattern 110. The sacrificial spacer 120 may be formed of a silicon oxide layer.

Referring to FIG. 1C, the active region 105a disposed under the upper gate trench 115 may be isotropically etched using the mask pattern 110 and the sacrificial spacer 120 as an etch mask to form a lower gate trench 125 having a greater width than the upper gate trench 115. Thus, a gate trench structure 133 having the upper gate trench 115 and the lower gate trench 125 may be formed. The lower gate trench 125 may be formed to have a rounded sidewall. The lower gate trench 125 may be formed to have a rounded bottom region.

Meanwhile, the gate trench structure 133 may define a source region 107s and a drain region 107d in the impurity region 107. Thus, the source and drain regions 107s and 107d may be formed apart from each other in the active region 105a. Also, the source and drain regions 107s and 107d may be formed at a higher level than the bottom region of the gate trench structure 133.

Referring to FIG. 1D, a semiconductor region 140 may be formed on an inner wall of the lower gate trench 125. The semiconductor region 140 may be formed of a different material from the active region 125. The semiconductor region 140 may be formed of SiGe, which has higher carrier mobility than Si. For example, the semiconductor region 140 may be formed of a SiGe layer or a SiGe layer 140a and a Si layer 140b which are sequentially stacked. The semiconductor region 140 may be formed using an epitaxial technique. For example, the semiconductor region 140 may be formed using a selective epitaxial growth (SEG) technique.

Referring to FIG. 1E, the mask pattern 110 (refer to FIG. 1D) and the sacrificial spacer 120 (refer to FIG. 1D) may be removed. Thereafter, a gate dielectric layer 145 may be formed on the semiconductor substrate 100 having the semiconductor region 140. The gate dielectric layer 145 may be a thermal oxide layer or a high-k dielectric layer. Thus, the gate dielectric layer 145 may be formed not only on the semiconductor region 140 but also on the exposed surface of the active region 105a.

Referring to FIG. 1F, a gate electrode 150 may be formed on the gate dielectric layer 145. The gate electrode 150 may fill the gate trench structure 133. Furthermore, the gate electrode 150 may fill the gate trench structure 133 and have a protrusion disposed at a higher level than the active region 105a. More specifically, a conductive layer and a capping layer may be sequentially formed on the semiconductor substrate 100 having the gate dielectric layer 145 and then patterned to form the gate electrode 150 and a capping mask 160 which are sequentially stacked. In this case, the gate electrode 150 may fill the gate trench structure 133. A gate spacer 165 may be formed on a sidewall of the gate electrode 150 and a sidewall of the capping mask 160, which are disposed at a higher level than the active region 105a.

Meanwhile, as described above, the impurity region 107 may be formed in the active region 105a as shown in FIG. 1A, and the gate trench structure 133 may define the source and drain regions 107s and 107d spaced apart from each other in the impurity region 107 as shown in FIG. 1C. An annealing process may be performed to active impurity ions in the source and drain regions 107s and 107d. The annealing process may be performed at least after the semiconductor region 140 is formed. For example, the annealing process may be performed on the semiconductor substrate 100 having the gate electrode 150 to active impurity ions in the source and drain regions 107s and 107d. Due to the annealing process, the impurity ions may be activated and diffused into adjacent portions of the semiconductor region 140. As a result, the source and drain regions 107s and 107d having activated impurity ions may be formed.

In another method, after forming the gate electrode 150, impurity ions may be implanted into portions of the active region 105a disposed on both sides of the gate electrode 150 and then activated to form the source and drain regions 107s and 107d.

Thus, the MOS transistor having a recessed channel region can be formed in the active region 105a. The semiconductor region 140 is located in a channel region of the MOS transistor. The semiconductor region 140 is formed of a SiGe layer. Therefore, the MOS transistor having the recessed channel region and high carrier mobility can be fabricated.

Next, a method of fabricating a MOS transistor according to another exemplary embodiment of the present invention will be described with reference to FIGS. 2A and 2B.

Referring to FIG. 2A, a semiconductor substrate 100 is prepared as described with reference to FIGS. 1A through 1C. Specifically, an isolation layer 105s is formed in the semiconductor substrate 100 to define an active region 105a, and a gate trench structure 133 including an upper gate trench 115 and a lower gate trench 125 may be formed. Also, a source region 107s and a drain region 107d may be formed as described with reference to FIGS. 1A through 1F.

A semiconductor region 240 may be formed on a sidewall of the lower gate trench 125. More specifically, an epitaxial layer may be formed using an epitaxial technique on an inner wall of the lower gate trench 125 and then anisotropically etched to remove the epitaxial layer on a bottom portion of the lower gate trench 125 and leave the semiconductor region 240 on the sidewall of the lower gate trench 125.

The semiconductor region 240 may be formed of a different material from the active region 105a. The semiconductor region 240 may be formed of SiGe, which has higher carrier mobility than Si. For example, the semiconductor region 240 may be formed of a SiGe layer or a SiGe layer 240a and a Si layer 240b which are sequentially stacked.

Referring to FIG. 2B, the mask pattern 110 (refer to FIG. 2A) and the sacrificial spacer 120 (refer to FIG. 2A) may be removed. Thereafter, a gate dielectric layer 245 may be formed on the semiconductor substrate 100 having the semiconductor region 240. A gate electrode 250 may be formed on the gate dielectric layer 245. The gate electrode 250 may fill the gate trench structure 133 and have a protrusion disposed at a higher level than the active region 105a. Specifically, a conductive layer and a capping layer may be sequentially formed on the semiconductor substrate 100 having the gate dielectric layer 245 and then patterned to form the gate electrode 250 and a capping mask 260 which are sequentially stacked. A gate spacer 265 may be formed on a sidewall of the gate electrode 250 and a sidewall of the capping mask 260, which are disposed at a higher level than the active region 105a. Alternatively, the gate electrode 250 may be buried in the gate trench structure 133.

Next, a method of fabricating a MOS transistor according to still another exemplary embodiment of the present invention will be described with reference to FIGS. 3A and 3B.

Referring to FIG. 3A, as described with reference to FIGS. 1A through 1C, a mask pattern 110 may be formed on a semiconductor substrate 100 and a gate trench structure 133 and a sacrificial spacer 120 may be formed in the semiconductor substrate 100. Also, as described with reference to FIGS. 1A through 1F, a source region 1107s and a drain region 1107d may be formed in an active region 105a.

Thereafter, the sacrificial spacer 120 may be selectively removed, and a semiconductor region 1140 may be formed on an inner wall of the gate trench structure 133. Thus, the semiconductor region 1140 may be formed on a sidewall of an upper gate trench 115 and an inner wall of a lower gate trench 125. The semiconductor region 1140 may be formed of a different material from the active region 105a. The semiconductor region 1140 may be formed of a SiGe layer. For example, the semiconductor region 1140 may be formed of a SiGe layer or a SiGe layer and a Si layer which are sequentially stacked.

Referring to FIG. 3B, the mask pattern 110 (refer to FIG. 3A) may be removed. A gate dielectric layer 1145 may be formed on the semiconductor substrate 100 having the semiconductor region 1140. A gate electrode 1150 may be formed on the gate dielectric layer 1145 to fill the gate trench structure 133. The gate electrode 1150 may be buried in the gate trench structure 133. An insulating pattern 1163 may be formed on the gate electrode 1150.

Alternatively, the gate electrode 1150 may be formed to fill the gate trench structure 133 and have a protrusion disposed at a higher level than the active region 105a.

Furthermore, portions of the semiconductor region 1140, which are adjacent to source and drain regions 1207s and 1207d, may have the same conductivity as the source and drain regions 1207s and 1207d. Also, a portion of the semiconductor region 1140, which is adjacent to the active region 105a, may have the same conductivity as the active region 105a. For example, as described with reference to FIG. 1F, after forming the semiconductor region 1140, an annealing process may be performed to diffuse impurity ions from the source and drain regions 1207s and 1207d into the semiconductor region 1140 adjacent to the source and drain regions 1207s and 1207d.

Next, a method of fabricating a MOS transistor according to yet another exemplary embodiment of the present invention will be described with reference to FIGS. 4A and 4B.

Referring to FIG. 4A, as described with reference to FIGS. 1A through 1C, a mask pattern 110 may be formed on a semiconductor substrate 100 and a gate trench structure 133 and a sacrificial spacer 120 (not shown in FIG. 4A) may be formed in the semiconductor substrate 100. Also, as described with reference to FIGS. 1A through 1F, a source region 1207s and a drain region 1207d may be formed in an active region 105a.

Thereafter, the sacrificial spacer 120 may be selectively removed. An epitaxial layer may be formed on an inner wall of the gate trench structure 133 and then anisotropically etched to remove the epitaxial layer from a bottom portion of the gate trench structure 133 and leave a semiconductor region 1240 on a sidewall of the gate trench structure 133. The semiconductor region 1240 may be formed of a SiGe layer. Particularly, since the semiconductor region 1240 is formed on a vertical plane, the carrier mobility of the MOS transistor can be further enhanced.

Referring to FIG. 4B, the mask pattern 110 may be removed. Thereafter, a gate dielectric layer 1245 may be formed on the semiconductor substrate 100 having the semiconductor region 1240. A gate electrode 1250 may be formed on the gate dielectric layer 1245 to fill the gate trench structure 133. The gate electrode 1250 may be buried in the gate trench structure 133. An insulating pattern 1263 may be formed on the gate electrode 1250.

Alternatively, the gate electrode 1250 may be formed to fill the gate trench structure 133 and have a protrusion disposed at a higher level than the active region 105a.

Next, a method of fabricating a MOS transistor according to yet another exemplary embodiment of the present invention will be described with reference to FIGS. 5A through 5C.

Referring to FIG. 5A, an isolation region 305s may be formed in a semiconductor substrate 300 to define an active region 305a. An impurity region may be formed in the active region 305a. A mask pattern 310 may be formed to have an opening crossing the active region 305a.

The active region 305a may be etched using the mask pattern 310 as an etch mask to form a gate trench structure 315. The gate trench structure 315 may be formed to have a vertical sidewall. The gate trench structure 315 may define a source region 307s and a drain region 307d in the impurity region.

Referring to FIG. 5B, an epitaxial layer may be formed using an epitaxial technique on an inner wall of the gate trench structure 315. Thereafter, the epitaxial layer may be anisotropically etched to remove the epitaxial layer from a bottom portion of the gate trench structure 315 and leave a semiconductor region 340 on the sidewall of the gate trench structure 315. The semiconductor region 340 may be formed of a SiGe layer. For example, the semiconductor region 340 may be formed of a SiGe layer or a SiGe layer and a Si layer which are sequentially stacked.

Referring to FIG. 5C, a gate dielectric layer 345 may be formed on the semiconductor substrate 300 having the semiconductor region 340. A conductive layer and a capping layer may be formed on the semiconductor substrate 300 having the gate dielectric layer 345 and then patterned to form a gate electrode 350 and a capping mask 360 which are sequentially stacked. The gate electrode 350 may be formed to fill the gate trench structure 315 and have a protrusion disposed at a higher level than the active region 105a. A gate spacer 365 may be formed on a sidewall of the gate electrode 350 and a sidewall of the capping mask 360 that are disposed at a higher level than the active region 305a. Alternatively, a buried gate electrode may be formed in the gate trench structure 315.

Meanwhile, portions of the semiconductor region 340, which are adjacent to the source and drain regions 307s and 307d, may have the same conductivity as the source and drain regions 307s and 307d. Also, a portion of the semiconductor region 340, which is adjacent to the active region 305a, may have the same conductivity type as the active region 305a. For example, after forming the semiconductor region 340, an annealing process may be performed to diffuse impurity ions from the source and drain regions 307s and 307d into the portions of the semiconductor region 340 adjacent to the source and drain regions 307s and 307d.

In the present invention, before performing the annealing process for diffusing the impurity ions, the source and drain regions 307s and 307d may correspond to inactivated impurity regions. Thereafter, due to the annealing process, impurity ions in the source and drain regions 307s and 307d may diffuse into the portions of the semiconductor regions 340 adjacent to the source and the drain regions 307s and 307d.

Next, a method of fabricating a MOS transistor according to yet another exemplary embodiment of the present invention will be described with reference to FIGS. 6A and 6B.

Figure 6A:
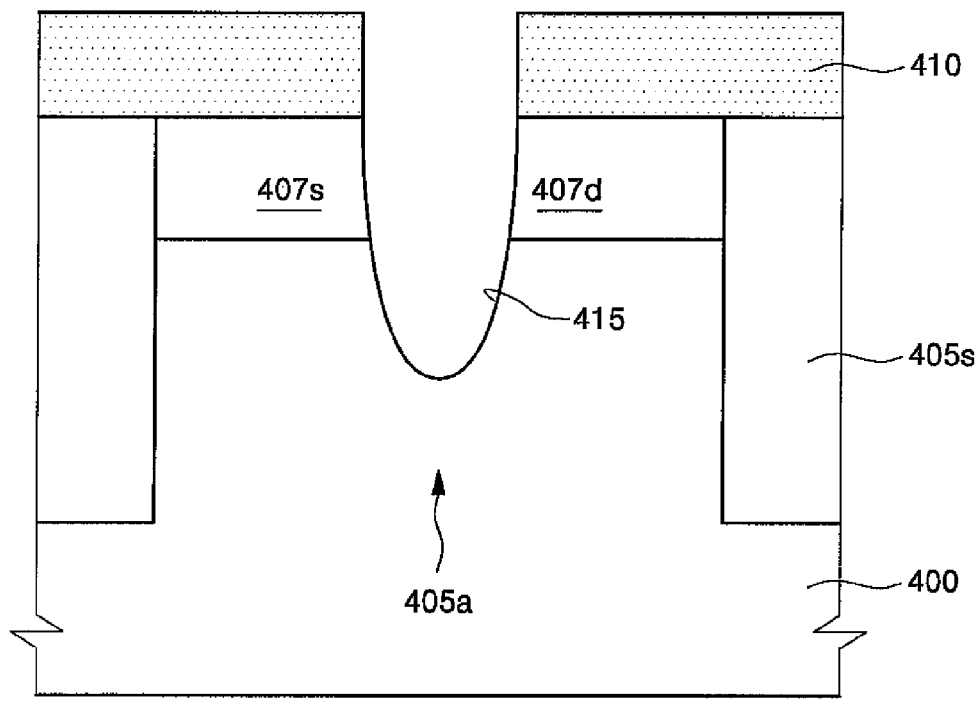
FIGS. 6A and 6B are cross-sectional views of a MOS transistor according to yet another exemplary embodiment of the present invention.

Referring to FIG. 6A, an isolation region 405s may be formed in a semiconductor substrate 400 to define an active region 405a. An impurity region may be formed in the active region 405a. A mask pattern 410 may be formed to have an opening crossing the active region 405a.

The active region 405a may be etched using the mask pattern 410 as an etch mask, thereby forming a gate trench structure 415 across the active region 405a. The gate trench structure 415 may be formed to have positively sloped sidewalls. Also, a boundary region between both sidewalls of the gate trench structure 415 may be rounded. Meanwhile, the gate trench structure 415 may define a source region 407s and a drain region 407d in the impurity region.

Figure 6B:
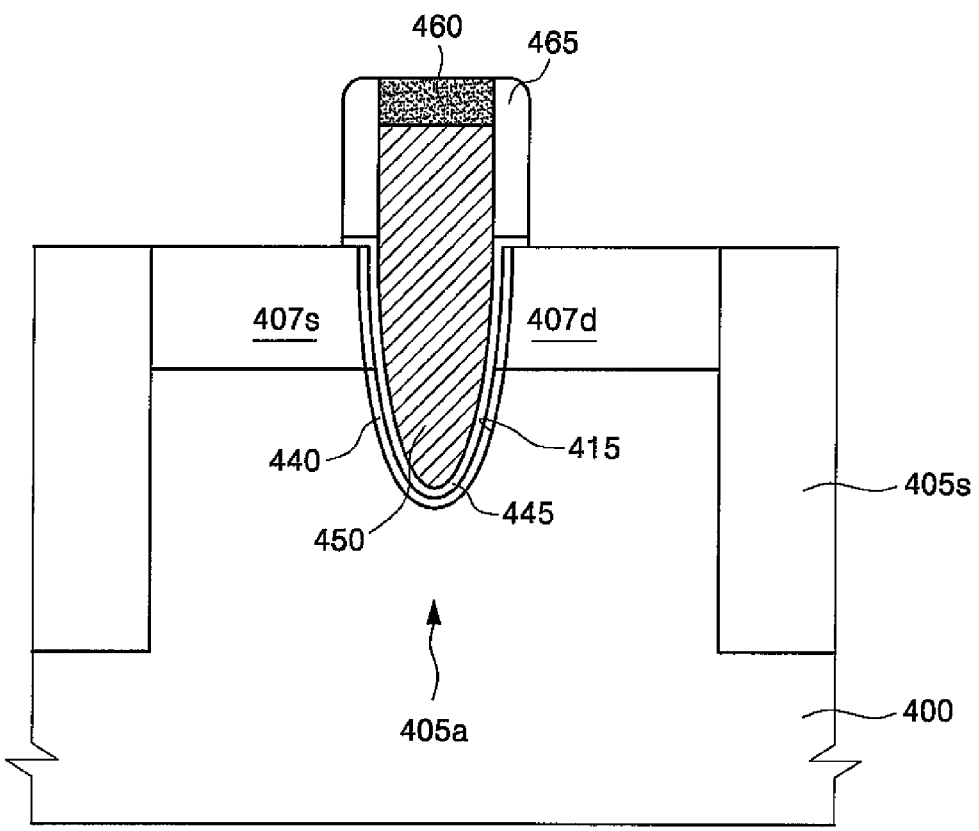

Referring to FIG. 6B, a semiconductor region 440 may be formed on an inner wall of the gate trench structure 415. The semiconductor region 440 may be formed of a different material from the active region 405a. The semiconductor region 440 may be formed of a SiGe layer. Thereafter, the mask pattern 410 (refer to FIG. 6A) may be removed. A gate dielectric layer 445 may be formed on the semiconductor substrate 400 having the semiconductor region 440. A conductive layer and a capping layer may be formed on the semiconductor substrate 400 having the gate dielectric layer 445. The conductive layer and the capping layer may be patterned to form a gate electrode 450 and a capping mask 460 which are sequentially stacked. The gate electrode 450 may be formed to fill the gate trench structure 415 and have a protrusion disposed at a higher level than the active region 405a.

Meanwhile, portions of the semiconductor region 440, which are adjacent to source and drain regions 407s and 407d, may have the same conductivity as the source and drain regions 407s and 407d. Also, a portion of the semiconductor region 440, which is adjacent to the active region 405a, may have the same conductivity type as the active region 405a. For example, after forming the semiconductor region 440, an annealing process may be performed to diffuse impurity ions from the source and drain regions 407s and 407d into the portions of the semiconductor region 440 adjacent to the source and drain regions 407s and 407d.

In an alternative embodiment, after forming the gate electrode 450, impurity ions may be implanted into the semiconductor region 440 and the active region 405a disposed at both sides of the gate electrode 450, and then activated to form the source and drain regions 407s and 407d.

According to exemplary embodiments of the present invention as described above, a semiconductor region formed of SiGe having higher carrier mobility than Si is formed in a gate trench structure disposed across an active region. The semiconductor region may serve as a recessed channel region of a MOS transistor. Therefore, since the semiconductor region having a high carrier mobility characteristic is used as the recessed channel region, the MOS transistor can have not only the recessed channel region but also improved current characteristics.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A MOS transistor comprising:
   an isolation region formed in a semiconductor substrate to define an active region;
   a source region and a drain region disposed in the active region and spaced apart from each other;
   a gate trench structure disposed in the active region between the source and drain regions, wherein the gate trench structure includes an upper gate trench crossing the active region and a lower gate trench disposed under the upper gate trench and having a width greater than the upper gate trench;
   a gate electrode disposed in the gate trench structure;
   a gate dielectric layer interposed between the gate trench structure and the gate electrode; and
   a semiconductor region disposed between an inner wall of the lower gate trench structure and the gate dielectric layer and formed of a different material than the active region, wherein the semiconductor region does not extend to a sidewall portion of the upper gate trench.

2. The MOS transistor according to claim 1, wherein the active region is formed of a silicon (Si) layer and the semiconductor region is formed of silicon-germanium (SiGe).

3. The MOS transistor according to claim 1, wherein the active region is formed of a silicon (Si) layer, the semiconductor region being formed of a silicon-germanium (SiGe) layer and a silicon (Si) layer, the SiGe layer and the Si layer of the semiconductor region being sequentially stacked.

4. The MOS transistor according to claim 1, wherein the lower gate trench has a rounded sidewall and a rounded bottom region.

5. A MOS transistor comprising:
   an isolation region formed in a semiconductor substrate to define an active region;
   a source region and a drain region disposed in the active region and spaced apart from each other;
   a gate trench structure disposed in the active region between the source and drain regions;
   a gate electrode disposed in the gate trench structure;
   a gate dielectric layer interposed between the gate trench structure and the gate electrode; and
   a semiconductor region disposed between at least a portion of the gate trench structure and the gate dielectric layer and formed of a different material from the active region,
   wherein the gate trench structure comprises:
   an upper gate trench crossing the active region; and
   a lower gate trench disposed under the upper gate trench and having a greater width than the upper gate trench, and
   wherein the semiconductor region is interposed between a sidewall of the lower gate trench and the gate electrode, and the semiconductor region does not extend between a bottom portion of the lower gate trench and the gate electrode.

* * * * *